United States Patent
Holmes et al.

(10) Patent No.: US 10,763,429 B2
(45) Date of Patent: Sep. 1, 2020

(54) SELF-ALIGNED ION BEAM ETCH SPUTTER MASK FOR MAGNETORESISTIVE RANDOM ACCESS MEMORY

(71) Applicant: International Business Machines Corporation, Armonk, NY (US)

(72) Inventors: Steve Holmes, Ossining, NY (US); Bruce B. Doris, Slingerlands, NY (US); Hyun K. Lee, LaGrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 42 days.

(21) Appl. No.: 16/158,791

(22) Filed: Oct. 12, 2018

(65) Prior Publication Data

US 2020/0119261 A1    Apr. 16, 2020

(51) Int. Cl.
*H01L 43/12* (2006.01)
*H01L 43/10* (2006.01)
*H01L 43/08* (2006.01)
*H01L 27/22* (2006.01)

(52) U.S. Cl.
CPC ............ *H01L 43/12* (2013.01); *H01L 27/226* (2013.01); *H01L 43/08* (2013.01); *H01L 43/10* (2013.01)

(58) Field of Classification Search
CPC . H01L 27/22–228; H01L 43/08; H01L 43/10; H01L 43/12
See application file for complete search history.

(56) References Cited

U.S. PATENT DOCUMENTS

| | | | |
|---|---|---|---|
| 6,037,262 A | 3/2000 | Hsia et al. | |
| 7,001,783 B2 | 2/2006 | Costrini et al. | |
| 8,623,736 B2 | 1/2014 | Liu | |
| 9,029,214 B2 | 5/2015 | Hoentschel et al. | |
| 9,166,154 B2 | 10/2015 | Satoh et al. | |
| 9,870,899 B2 | 1/2018 | Yang et al. | |
| 2016/0276579 A1 | 9/2016 | Gaidis et al. | |
| 2018/0019387 A1 | 1/2018 | Tan et al. | |
| 2018/0123029 A1* | 5/2018 | Park .................. H01L 27/222 |

FOREIGN PATENT DOCUMENTS

WO    2017048271 A1    3/2017

* cited by examiner

Primary Examiner — Robert G Bachner
Assistant Examiner — Molly K Reida
(74) Attorney, Agent, or Firm — Cantor Colburn LLP; Vazken Alexanian

(57) ABSTRACT

Embodiments of the present invention are directed to a method for fabricating a magnetoresistive random access memory (MRAM) device. A non-limiting example of the method includes depositing a dielectric layer on a contact arranged on a substrate including a magnetic tunnel junction (MTJ) pillar. The method includes reducing a width of the MTJ pillar. The method further includes depositing an encapsulation layer on the dielectric layer and the MTJ pillar.

12 Claims, 5 Drawing Sheets

SELF-ALIGNED ION BEAM ETCH SPUTTER MASK FOR MAGNETORESISTIVE RANDOM ACCESS MEMORY

BACKGROUND

The present invention generally relates to fabrication methods and resulting structures for magnetoresistive random access memory (MRAM). More specifically, the present invention relates to a self-aligned ion beam etch (IBE) sputter mask for MRAM.

MRAM is a solid state, non-volatile memory that uses magnetoresistance to store information. MRAM includes an electrically connected array of magnetoresistive memory elements, referred to as magnetic tunnel junctions (MTJs). Each MTJ includes two magnetic layers separated by an insulator layer. Electrons can tunnel from one ferromagnetic layer to the other when the insulating layer is thin enough.

An applied write current can be used to individually switch the magnetization directions of the magnetic layers. If the magnetization directions are in a parallel orientation, electrons are more likely to tunnel through the insulator layer than when in an antiparallel orientation. Consequently, such a junction can be switched between two states of electrical resistance, one with low and one with very high resistance.

SUMMARY

Embodiments of the present invention are directed to a method for fabricating a magnetoresistive random access memory (MRAM) device. A non-limiting example of the method includes depositing a dielectric layer on a contact arranged on a substrate including a magnetic tunnel junction (MTJ) pillar. The method includes reducing a width of the MTJ pillar. The method further includes depositing an encapsulation layer on the dielectric layer and the MTJ pillar.

Another non-limiting example of the method includes depositing, by spin coating, a dielectric layer on a contact arranged on a substrate including a magnetic tunnel junction (MTJ) pillar. The method includes reducing a width of the MTJ pillar to form a gap between a vertical sidewall of the MTJ pillar and the dielectric layer. The method further includes depositing an encapsulation layer on the dielectric layer and the MTJ pillar.

Embodiments of the present invention are directed to a MRAM device. A non-limiting example of the MRAM device includes a magnetic tunnel junction (MTJ) pillar arranged on a substrate including a contact. The MRAM device includes a dielectric layer arranged directly on the contact. The MRAM device further includes an encapsulation layer arranged on the dielectric layer and the MTJ pillar. The encapsulation layer directly contacts a vertical sidewall of the MTJ pillar and directly contacts the dielectric layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-5 depict a process flow for fabricating a MRAM device according to embodiments of the present invention, in which:

FIG. 1 depicts a cross-sectional side view of the MRAM device subsequent to forming a contact on a substrate;

FIG. 2 depicts a cross-sectional side view of the MRAM device subsequent to forming an MTJ pillar on the contact;

FIG. 3 depicts a cross-sectional side view of the MRAM device subsequent to depositing a dielectric layer on the substrate;

FIG. 4 depicts a cross-sectional side view of the MRAM device subsequent to reducing the width of the MTJ pillar; and FIG. 5 depicts a cross-sectional side view of the MRAM device subsequent to depositing an encapsulation layer on the MTJ pillar.

Figure 1:
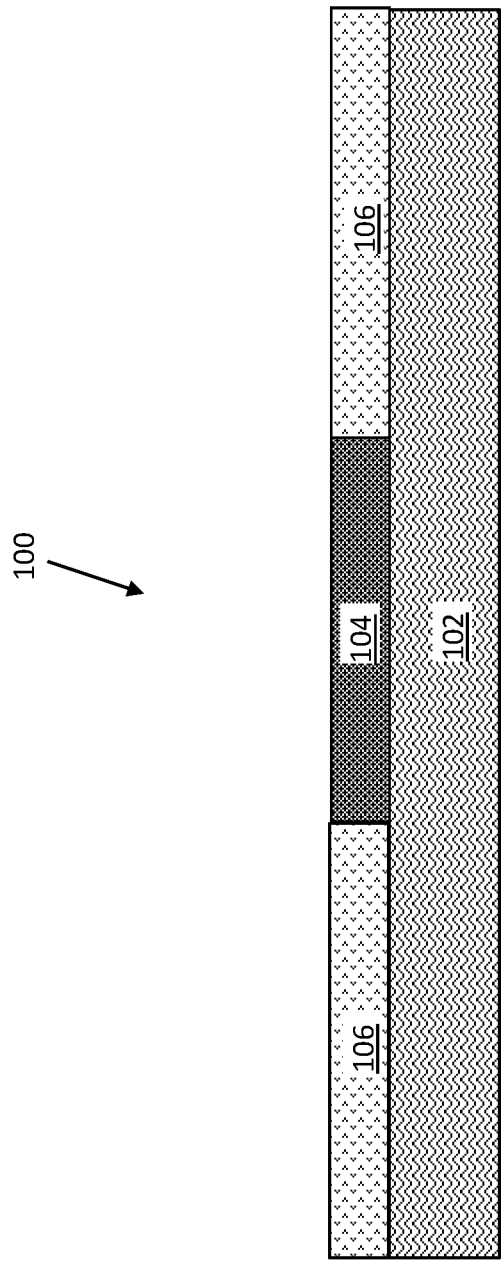

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, MRAM device fabrication includes depositing and subsequently reducing the width of MTJ pillar structures, for example by angled etching (e.g., ion beam etching). The MTJ pillars are arranged on a conductive pad (e.g., a layer of TaN or TiN). During the angled etching, the conductive material from the conductive pad can be inadvertently redeposited onto the vertical sidewalls of the magnetic pillar, which can cause shorting across the insulating layer of the MTJ.

Various approaches have been attempted to prevent conductive material redeposition onto the MTJ pillar. A lithographic mask layer has been used to protect the conductive pad from etching. In such methods, an opening is formed in the mask, and the MTJ pillar is deposited through the opening. The pillar is then subsequently etched, with the contact pad being protected by the mask. However, this approach has drawbacks because the MTJ pillar has to be properly aligned with the small opening, which is difficult and costly. Further, the mask may or may not completely cover the conductive material.

Turning now to an overview of the aspects of the invention, one or more embodiments of the invention address the above-described shortcomings of the prior art by providing methods for fabricating a MRAM device and resulting structures in which a dielectric layer is deposited onto the substrate (e.g., by spin coating) after forming the MTJ pillar. The dielectric layer is thin enough such that it does not coat the vertical sidewalls of the MTJ pillar, which enables subsequent trimming by etching processes (e.g., IBE). The thin dielectric layer coats the conductive pad under the MTJ pillar, masking the magnetic material of the contact and avoiding redeposition of conductive material on vertical sidewalls of the MTJ pillar.

The above-described aspects of the invention address the shortcomings of the prior art by providing a self-aligned dielectric mask that protects the conductive pad beneath the MTJ pillar. Any dielectric material from the protective layer that is deposited on sidewalls of the MTJ pillar during etching will not result in MTJ shorting.

Turning now to a more detailed description of aspects of the present invention, FIGS. 1-5 depict a process flow for fabricating a MRAM device 100 according to embodiments of the present invention. FIG. 1 depicts a cross-sectional side view of the MRAM device 100 subsequent to forming a contact 104 on a substrate 102.

The substrate 102 includes one or more semiconducting materials, such as silicon, and one or more layers of conducting, semi-conducting, and insulating materials fabricated on the silicon substrate. The substrate 102 can include one or more metal-oxide-semiconductor field-effect transistors (MOSFET) formed thereon.

Non-limiting examples of suitable semiconducting materials that can be included in the substrate 102 include germanium, silicon carbide, silicon germanium, silicon germanium carbide, silicon alloys, germanium alloys, III-V materials (e.g., gallium arsenide (GaAs), indium arsenide (InAs), indium phosphide (InP), or aluminum arsenide (AlAs)), II-VI materials (e.g., cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), or any combination thereof.

The substrate 102 can be a silicon-on-insulator (SOI) substrate or a silicon-germanium-on-insulator (SGOI) substrates with buried oxide (BOX) layers. The BOX layers can be an oxide, for example silicon dioxide, or a nitride, for example, silicon nitride.

A dielectric layer 106 is arranged on the substrate 102. The dielectric layer 106 includes, but is not limited to, one or more dielectric materials such as silicon oxide, spin-on-glass, a flowable oxide, a high density plasma oxide, borophosphosilicate glass (BPSG), or any combination thereof.

An opening can be formed in the dielectric layer 106, into which a conductive material is deposited to form the contact 104, which is also referred to herein as the first contact or bottom contact. The conductive material forming the contact 104 can include, but is not limited to, include tantalum (Ta), tantalum nitride (TaN), titanium (Ti), titanium nitride (TiN), or any combination thereof. The conductive material can be deposited by, for example, physical vapor deposition (PVD), ion beam deposition (IBD), atomic layer deposition (ALD), or like processes.

Figure 2:
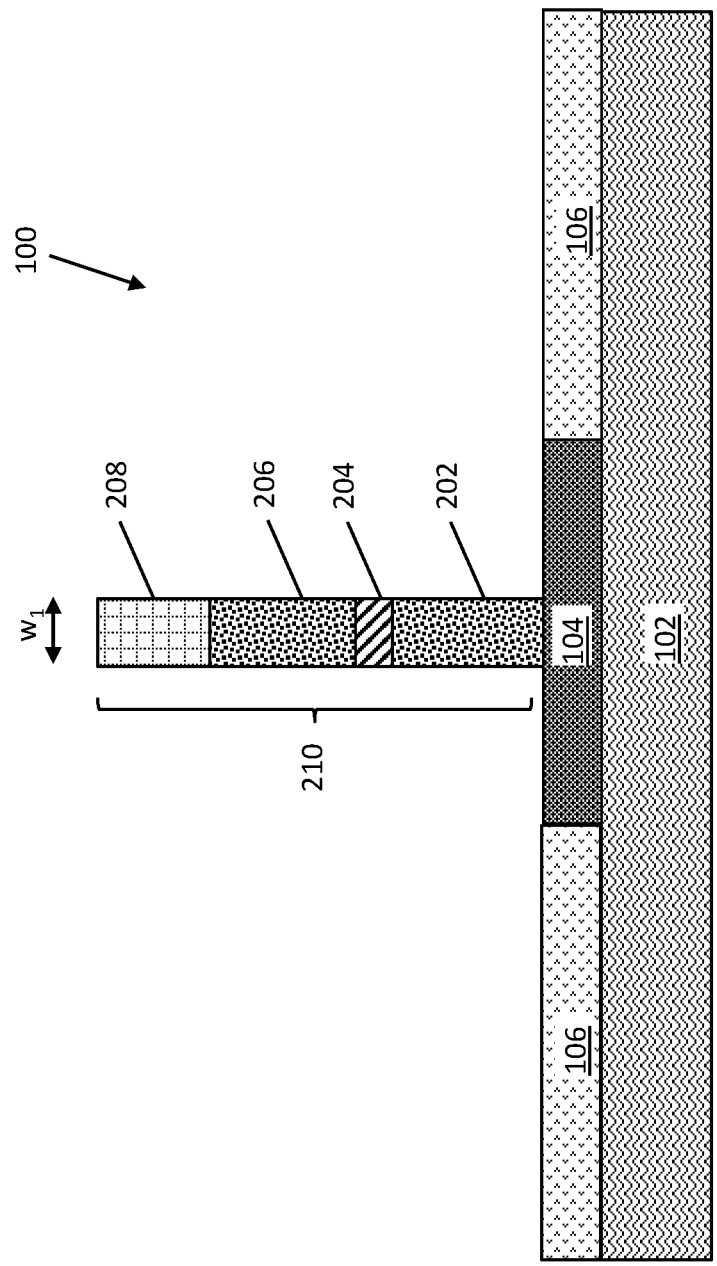

FIG. 2 depicts a cross-sectional side view of the MRAM device 100 subsequent to forming MTJ pillar 210 on the contact 104. The MTJ pillar 210 includes a magnetic reference layer 202, a tunnel barrier layer 204, a magnetic free layer 206, and a conductive cap 208.

To form the MTJ pillar 210, the magnetic reference layer 202 is deposited as a blanket layer on the contact 104, the tunnel barrier layer 204 is deposited as a blanket layer on the magnetic reference layer 202, and the magnetic free layer 206 is deposited as a blanket layer on the tunnel barrier layer 204.

The reference layer 202 and the free layer 206 each include conductive, magnetic materials, for example, metals or metal alloys. The reference layer 202 and the free layer 206 each include one layer or multiple layers, and can include the same or different materials.

Non-limiting examples of suitable materials for each of the reference layer 202 and the free layer 206 include iron, cobalt, boron, aluminum, nickel, silicon, oxygen, carbon, zinc, beryllium, vanadium, boron, magnesium, or any combination thereof. The reference layer 202 and the free layer 206 are each formed employing a deposition process, for example, PVD, IBD, ALD, or other like processes.

The tunnel barrier layer 204 includes a non-magnetic, insulating (dielectric) material. A non-limiting example of an insulating material for the tunnel barrier layer 204 includes magnesium oxide (MgO).

The tunnel barrier layer 204 is formed on the reference layer 202 by, for example, radiofrequency (RF) sputtering in some embodiments of the present invention. Alternatively, the tunnel barrier layer 204 is formed by oxidation (e.g., natural or radical oxidation) of a magnesium (Mg) layer deposited on the reference layer 202 according to other embodiments of the present invention.

The conductive cap 208 includes a conductive hard mask material. Non-limiting examples of conductive hard mask materials include tantalum nitride (TaN), titanium (Ti), titanium nitride (TiN), or any combination thereof.

The material forming the conductive cap 208 is deposited by employing a suitable process, for example, PVD, IBD, or other like processes. After depositing the conductive hard mask material, the material is then patterned and etched, e.g., by a reactive ion etch (RIE) process or a halogen-based chemical etch process (e.g., including chlorine-containing gas and/or fluorine-containing gas chemistry). The pattern from the hard conductive hard mask is transferred into the free layer 206, the tunnel barrier layer 204, and the reference layer 202. The free layer 206, tunnel barrier layer 204, and reference layer 202 are etched by, for example, performing a MRAM stack etch process. The stack etch process is, for example, a RIE process or an IBE process.

The starting width (w) (also referred to as the first width herein) of the MTJ pillar 210 is slightly larger than the intended final width. According to one or more embodiments of the present invention, the first width $w_1$ is about 20 to about 1000 nm. According to other embodiments of the present invention, the first width $w_1$ is about 20 to about 100.

Figure 3:
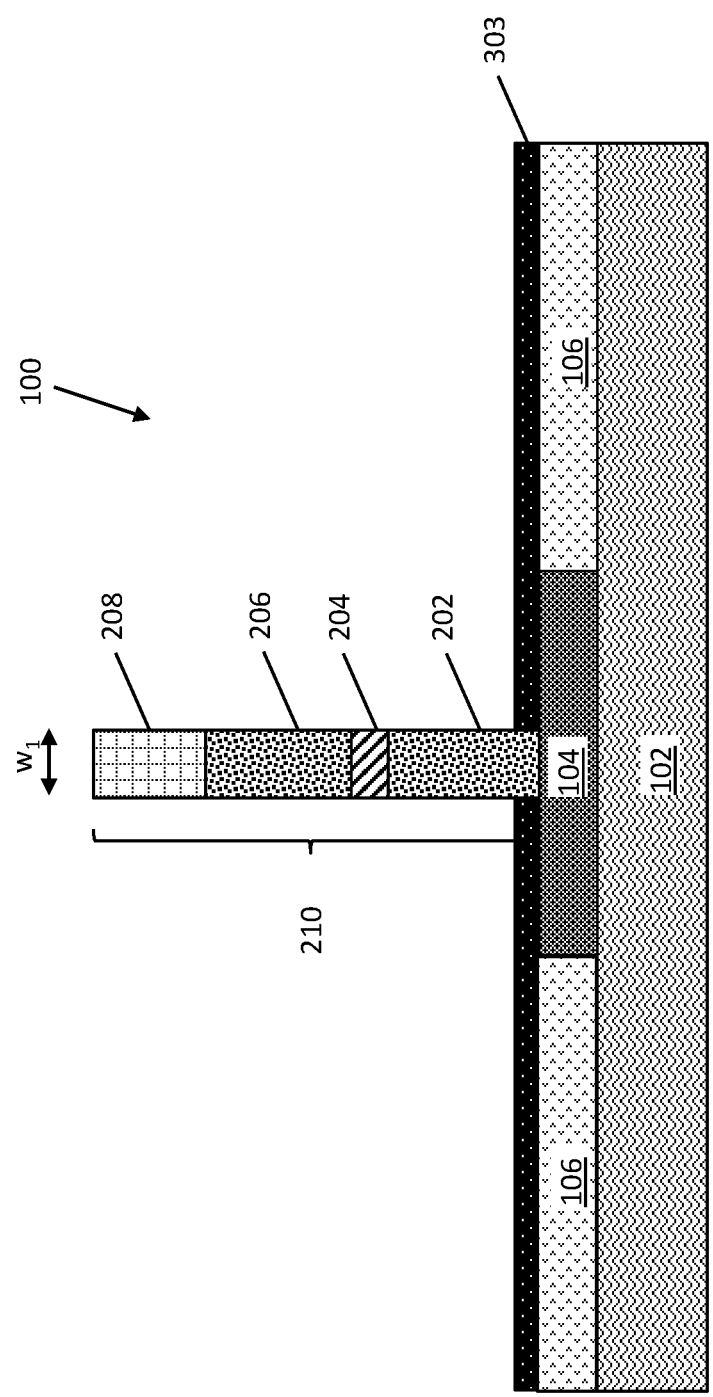

FIG. 3 depicts a cross-sectional side view of the MRAM device 100 subsequent to depositing a dielectric layer 303 directly on the contact 104. The MTJ pillar 210 is also arranged directly on the contact 104. The dielectric layer 303 is deposited as a thin enough layer that it does not coat the vertical sidewalls of the MTJ pillar 210, except for at the base of the MTJ pillar 210 at the interface with the contact 104.

Non-limiting examples of materials for the dielectric layer 303 include oxides, nitrides, oxynitrides, silicates (e.g., metal silicates), aluminates, titanates, nitrides, or any combination thereof.

Examples of high-k dielectric materials for the dielectric layer 303 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

According to one or more embodiments of the present invention, the thickness of the dielectric layer 303 is about 3 to about 50 nm. According to other embodiments of the present invention, the thickness of the dielectric layer 303 is about 5 to about 15 nm.

The dielectric layer 303 is formed by performing a deposition process, for example, plasma enhanced chemical vapor deposition (PECVD), CVD, PVD, IBD, or other like processes.

The dielectric layer 303 is deposited by spin coating according to one or more embodiments of the present invention. For example, a small amount of dielectric coating material can be deposited onto the substrate to be coated, which is either spinning at low speed or not spinning at all. The substrate is then rotated at high speed in order to spread the dielectric coating material by centrifugal force.

Figure 4:
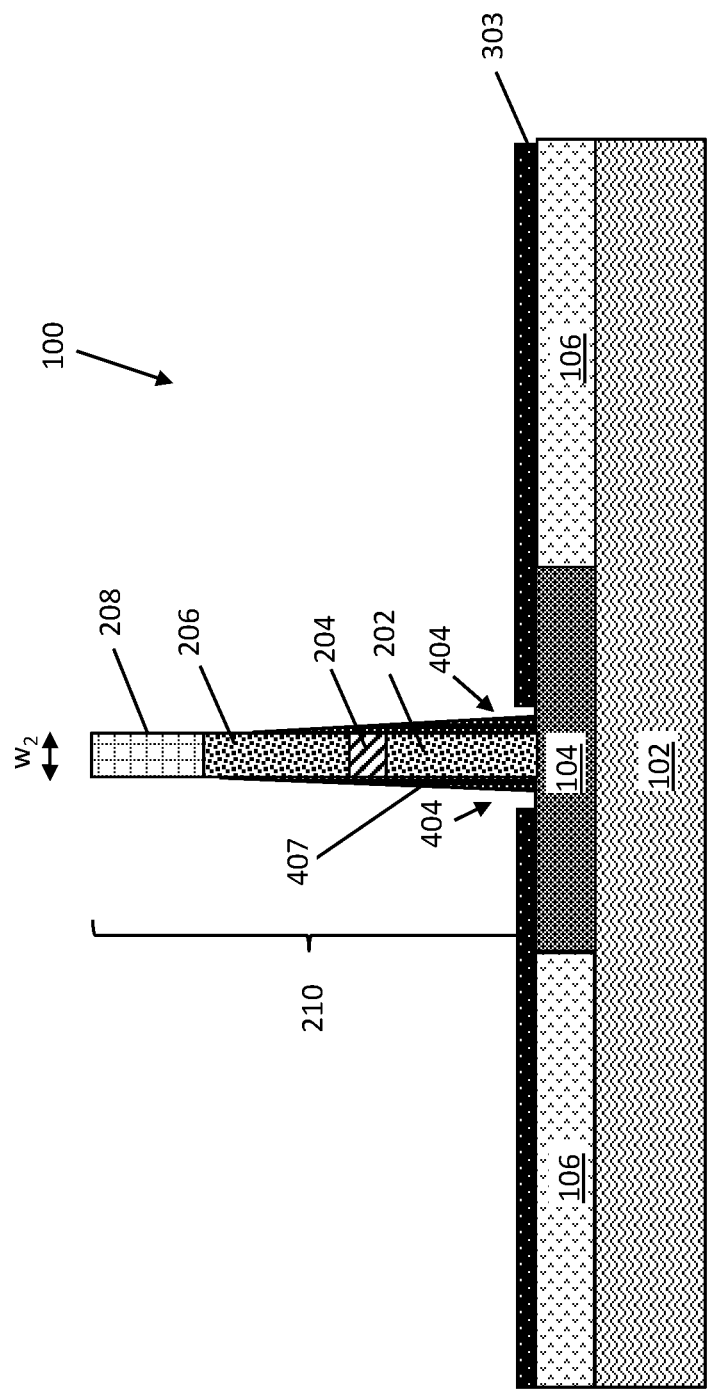

FIG. 4 depicts a cross-sectional side view of the MRAM device 100 subsequent to reducing the width of the MTJ pillar 210. According to one or more embodiments of the present invention, etching, such as an angled etching process is used to reduce the width.

The width (first width $w_1$, as shown in FIG. 2), is reduced by trimming the vertical sidewalls of the MTJ pillar 210 to the desired final width $w_2$, which is also referred to as the second width herein.

According to one or more embodiments of the present invention, the second width $w_2$ is about 3 to about 1000 nm. According to other embodiments of the present invention, the second width $w_2$ is about 5 to about 50 nm.

As the width of the MTJ pillar 210 is reduced to form gaps 404 between the vertical sidewalls of the MTJ pillar 210 and the dielectric layer 303, the dielectric layer 303 protects the contact 104. Thus, instead of conductive material from the contact 104 being redeposited on vertical sidewalls of the MTJ pillar 210, which can result in shorting, a portion of the dielectric material from the dielectric layer 303 may or may not be redeposited onto the vertical sidewalls of the MTJ pillar 210 as dielectric redeposition layer 407.

According to one or more embodiments of the present invention, the etching process used to trim the MTJ pillar 210 is IBE, in which an ion beam of charged particles is used to etch the MTJ pillar 201. According to other embodiments of the present invention, the etching process used to trim the MTJ pillar 210 is an isotropic plasma etch.

Figure 5:
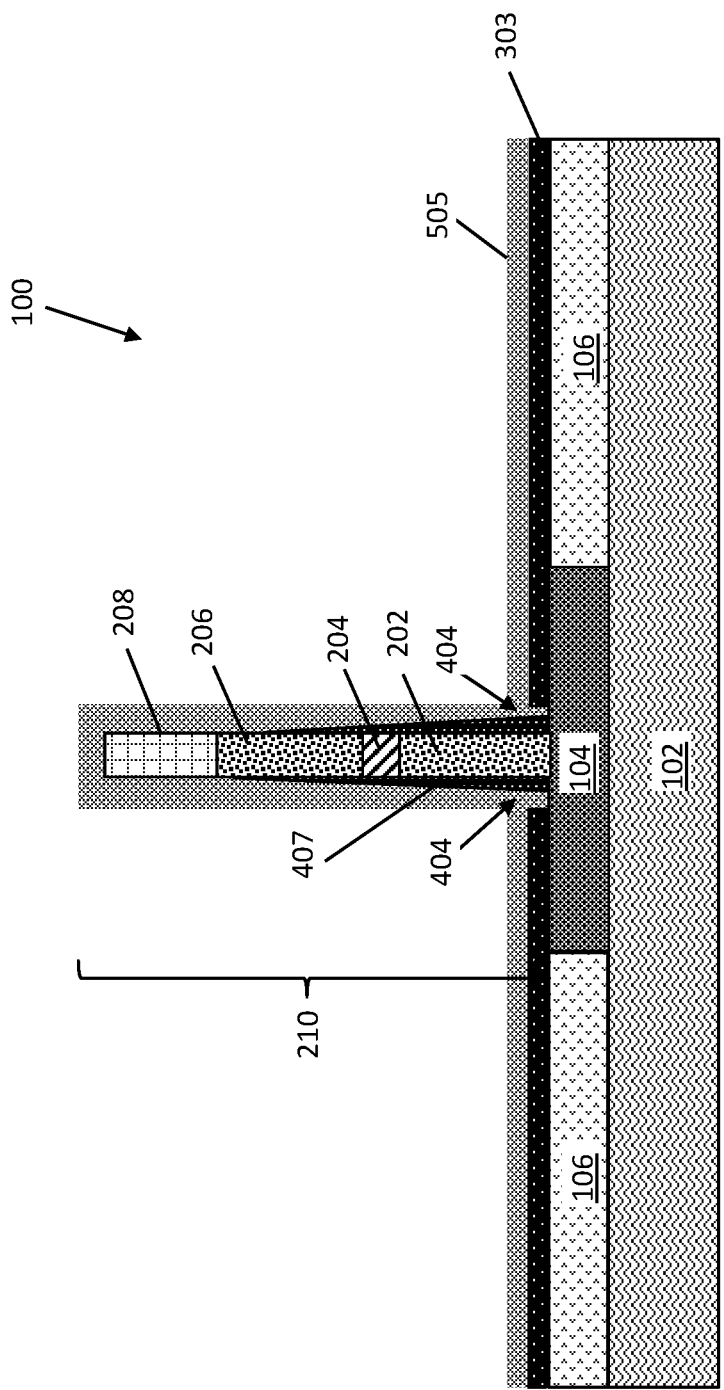

FIG. 5 depicts a cross-sectional side view of the MRAM device 100 subsequent to depositing an encapsulation layer 505 on the MTJ pillar 210. The encapsulating layer 505 includes one or more insulating materials. The encapsulating layer encapsulates exposed areas of the MTJ pillar 210 (including the vertical sidewalls) and covers (and directly contacts) the dielectric layer 303. The encapsulation layer 505 and the dielectric layer 303 are discrete and separate layers.

The encapsulating layer 505 is formed on the MTJ pillar 210 and dielectric layer 303 by performing a deposition process, for example, plasma enhanced chemical vapor deposition (PECVD), CVD, PVD, IBD, or other like processes.

Non-limiting examples of materials for the encapsulation layer 505 include silicon nitride, aluminum oxide ($Al_2O_3$), amorphous carbon (a-C), SiBCN, SiOCN, or any combination thereof.

According to one or more embodiments of the present invention, the material of the encapsulation layer 505 is the same as the material forming the dielectric layer 303. According to other embodiments of the present invention, the material of the encapsulation layer 505 is different than the material forming the dielectric layer.

The thickness of the encapsulation layer 505 generally varies and is not intended to be limited. In some embodiments of the present invention, the thickness of the encapsulation layer 505 is in a range from about 2 to about 50 nm. In other embodiments, the thickness of the encapsulation layer 505 is in a range from about 2 to about 10 nm.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a magnetoresistive random access memory (MRAM) device, the method comprising:
   depositing a dielectric layer on a contact arranged on a substrate comprising a magnetic tunnel junction (MTJ) pillar;
   reducing a width of the MTJ pillar; and
   depositing an encapsulation layer on the dielectric layer and the MTJ pillar;
   wherein reducing the width of the MTJ pillar causes a portion of the dielectric layer to redeposit onto a vertical sidewall of the MTJ pillar.

2. The method of claim 1, wherein the MTJ pillar is arranged directly on the contact.

3. The method of claim 1, wherein the dielectric layer is not deposited on the vertical sidewalls of the MTJ pillar.

4. The method of claim 1, wherein reducing the width of the MTJ pillar comprises ion beam etching.

5. The method of claim 1, wherein the dielectric layer and the encapsulation layer comprise different dielectric materials.

6. The method of claim 1, wherein the dielectric layer and the encapsulation layer comprise the same dielectric materials.

7. A method of fabricating a magnetoresistive random access memory (MRAM) device, the method comprising:
   depositing, by spin coating, a dielectric layer on a contact arranged on a substrate comprising a magnetic tunnel junction (MTJ) pillar;
   reducing a width of the MTJ pillar to form a gap between a vertical sidewall of the MTJ pillar and the dielectric layer; and
   depositing an encapsulation layer on the dielectric layer and the MTJ pillar.

8. The method of claim 7, wherein the dielectric layer is not deposited on the vertical sidewalls of the MTJ pillar.

9. The method of claim 7, wherein reducing the width of the MTJ pillar comprises ion beam etching.

10. The method of claim 7, wherein reducing the width of the MTJ pillar causes a portion of the dielectric layer to redeposit onto a vertical sidewall of the MTJ pillar.

11. The method of claim 7, wherein the dielectric layer and the encapsulation layer comprise different dielectric materials.

12. The method of claim 7, wherein the dielectric layer and the encapsulation layer comprise the same dielectric materials.

* * * * *